(12) United States Patent  
Wilson et al.

(10) Patent No.: US 8,089,108 B2  
(45) Date of Patent: Jan. 3, 2012

(54) DOUBLE-GATED TRANSISTOR MEMORY

(75) Inventors: Dale G. Wilson, Kuna, ID (US); Douglas R. Hackler, Sr., Boise, ID (US)

(73) Assignee: American Semiconductor, Inc., Boise, ID (US)

( * ) Notice: Subject to any disclaimer, the term of this patent is extended or adjusted under 35 U.S.C. 154(b) by 0 days.

(21) Appl. No.: 13/036,807

(22) Filed: Feb. 28, 2011

(65) Prior Publication Data

US 2011/0147806 A1 Jun. 23, 2011

Related U.S. Application Data

(62) Division of application No. 11/678,026, filed on Feb. 22, 2007, now Pat. No. 7,898,009.

(51) Int. Cl.  
*H01L 29/80* (2006.01)

(52) U.S. Cl. ........................................ 257/278

(58) Field of Classification Search ............ 257/278  
See application file for complete search history.

(56) References Cited

U.S. PATENT DOCUMENTS

| | | | |
|---|---|---|---|
| 5,412,596 A | 5/1995 | Hoshiba | |
| 5,856,688 A | 1/1999 | Lee | |
| 5,959,879 A | 9/1999 | Koo | |
| 6,532,165 B1 | 3/2003 | Katori | |
| 6,815,772 B2 | 11/2004 | Takemura | |
| 6,831,310 B1 | 12/2004 | Mathew et al. | |
| 6,876,022 B2 | 4/2005 | Salling et al. | |
| 2005/0001218 A1* | 1/2005 | Hackler et al. | ............ 257/78 |
| 2006/0115939 A1 | 6/2006 | Walker et al. | |

OTHER PUBLICATIONS

Van Huylenbroeck et al., Investigation of PECVD Dielectrics for Nondispersive Metal-Insulator-Metal Capacitors, IEEE Electron Device Letters, vol. 23, No. 4, Apr. 2002, pp. 191-193.

* cited by examiner

*Primary Examiner* — Bradley K Smith  
(74) *Attorney, Agent, or Firm* — Your Intellectual Property Matters, LLC; Robert A. Frohwerk

(57) ABSTRACT

Memory cells are constructed from double-gated four terminal transistors having independent gate control. DRAM cells may use one, two or three transistors. Single transistor cells are constructed either with or without a bit storage capacitor, and both NAND- and NOR-type Non-Volatile NVRAM cells, as well as Ferroelectric FeRAM cells, are described. For all cells, top gates provide conventional access while independent bottom gates provide control to optimize memory retention for given speed and power parameters as well as to accommodate hardening against radiation. In a single transistor cell without a capacitor, use of the bottom gate allows packing to a density approaching $2 F^2$. The memory cells are compatible with SOI logic circuitry for use as embedded RAM in SOC applications.

21 Claims, 12 Drawing Sheets

|  | Store | | Write | | Read | |
|---|---|---|---|---|---|---|
| Data Value | 1 | 0 | 1 | 0 | 1 | 0 |
| Read BL=Drain | 0 | | 0 | | 0.5 | |
| Write BL=Top Gate | 0 | | 1.0 | -1.0 | 0 | |
| WL=Bottom Gate | -0.5 | | 0 | | 0.5 | |
| $V_t$ | $1.0-\Delta V_t$ | $1.0+\Delta V_t$ | $0.5-\Delta V_t$ | $0.5+\Delta V_t$ | $0.0-\Delta V_t$ | $0.0+\Delta V_t$ |
| Source is Grounded | | | | | | |

Operations for the IDG-FET Single Transistor (1T) FeRAM

FIG. 14

Operating Modes Showing Normal and Disturb Conditions
for the IDG-FET Single Transistor (1T) FeRAM

DOUBLE-GATED TRANSISTOR MEMORY

CROSS-REFERENCES TO RELATED APPLICATIONS

U.S. patent application Ser. No. 11/307,863 filed Feb. 25, 2006, entitled "Independently-Double-Gated Field Effect Transistor," is incorporated here by reference.

This application is a Division of U.S. patent application Ser. No. 11/678,026, filed Feb. 22, 2007, to be issued as U.S. Pat. No. 7,898,009, which is incorporated here by reference in its entirety.

STATEMENT REGARDING FEDERALLY SPONSORED RESEARCH OR DEVELOPMENT

Not Applicable.

FIELD OF THE INVENTION

The present invention relates to the composition and manufacture of solid-state memory devices. More specifically, both volatile and non-volatile memory cells are described, all of which use transistors with multiple, independent gate electrodes. Hysteresis-producing material, such as Ferroelectric insulators for transistor gates and capacitors, is incorporated into some embodiments.

BACKGROUND OF THE INVENTION

Temporary storage of information for today's computing devices is provided by Random Access Memory (RAM). As computer software programs become ever larger and more complex, more and more RAM is required in order to perform the desired computations. A necessary resource, the amount of RAM available for a given task affects the processing capability of any computing system. A RAM component includes a number of cells or storage locations each of which can hold the logic state of a single binary-digit (bit), the smallest amount of information used by a computer. Each bit is either active or inactive, '1' or '0', respectively.

Large arrays of RAM cells are used to store vast amounts of information. In order to access individual items from these vast arrays, the RAM cells are arranged so that they can be addressed, much like small mailboxes at street intersections, into groups that are most commonly organized by Rows and Columns, each cell having a unique Row/Column reference.

As the size of RAM arrays has grown into and beyond megabits, designers of memory systems have been forced to focus much attention on considerations of size and power consumption. One approach to both of these issues has been the use of Dynamic Random Access Memory (DRAM) cells. As described first by Robert H. Dennard of IBM in U.S. Pat. No. 3,387,286 for "Field-Effect Transistor Memory," each DRAM cell can be constructed from a single transistor and a capacitor, a design which has come to be referred to as a 1T-1C (One-transistor, One-capacitor) memory cell. In operation the transistor serves as an input to control the charging of the capacitor during writing and the interrogation of the charge on the capacitor during reading in order to determine the stored logic state. Since this configuration has no inherent remanence, as there had been with the earlier magnetic core memories or with data bit latches, leakage currents allow charge to drain from the capacitor over time, resulting in a potential loss of the associated information. It is necessary to recharge the capacitor to refresh the state of the memory cell in order to avoid loss of the information stored by it. Furthermore, when a conventional capacitor is used in the initial 1T-1C design the read out is destructive. This has been overcome with designs that use two transistors per cell to provide a nondestructive read out.

As higher density has been required of DRAM cells it has been difficult for memory designers to maintain the necessary storage capacitance of about 25 fF (femto-Farads) per cell. Capacitors have been fabricated using 3-D (three-dimensional) designs, including trench and stacked capacitors. The desire for higher k dielectrics (where k refers to the dielectric constant) has seen the replacement of silicon dioxide initially with silicon nitride and then other more exotic materials. The area required for a memory cell is measured in terms of the minimum feature size F of a given fabrication process. When the 1T-1C cell was first developed at IBM in 1968, the feature size was F=8 μm and the cell area was 20 $F^2$. Advances in on-chip capacitors have reduced the memory cell to 6 $F^2$, where F is below 100 nm.

Another approach to reducing the area dedicated to capacitance has been the extreme of removing the capacitor from the 1T-1C (One-transistor, One-capacitor) cell to create a 1T-0C, or Zero-capacitor, DRAM cell. First described in "A Capacitor-Less 1T-DRAM Cell" by S. Okhonin, et al. (IEEE Electron Device Letters, Vol. 23, No. 2, February 2002), this capacitor-less structure achieved the smallest area of any memory structure recognized at the time of its introduction and has become known as a floating body memory, since the necessary charge storage was accommodated by the Floating Body (FB) effect available in SOI (Silicon-on-Insulator) transistors.

The simplicity of the DRAM cell is offset by the complexity of the means for accessing and refreshing the cell. Access may require a delay of multiple clock cycles of the processor while a selected row and column are prepared before a specific cell can be written or read, and all accesses will occasionally be held off while a block of DRAM cells is refreshed. Also, with ever higher densities, the storage capacitors on which the data is stored have become so small that they can be disturbed by ionizing radiation events resulting in soft errors. Non-volatile memories that do not lose their stored information when power is lost and do not need to be periodically refreshed are highly desirable. Flash memories achieve these goals while also providing high density. However, flash memories have very slow write times, high voltage and power requirements, and reliability concerns.

A key concern in memory components is being able to generate smaller devices that consume less power. Although significant progress has been made in this area, a common problem with transistors is the gate voltage control of the channel as the device decreases in size. Gate voltage control is achieved by exerting a field effect on the channel. As the transistor size decreases, short-channel effects become more problematic and interfere with the gate voltage's ability to provide exclusive channel control. Ideally, total control of the channel should rest with the gate voltage.

The art would be advanced by providing memory cells with improved density, superior gate control, and non-volatile storage. Such devices are disclosed and claimed herein.

BRIEF SUMMARY OF THE INVENTION

The present invention applies a double-gated CMOS Field Effect Transistor (FET) technology to the improvement of existing volatile and non-volatile (NV) Random Access Memories (RAMs), and to the realization of novel RAMs that utilize the second gate, all known existing memories being single gated. It also applies to the use of this double-gated transistor with an incorporated hysteresis-producing material, such as a ferroelectric gate insulator for a FeFET, to make possible a non-volatile, fast read/write, compact one-transistor RAM cell. The novel feature of the presently described devices is the availability of a second (bottom) gate for each transistor in the memory cell, where the second gate may be connected either independently or in parallel with the first gate. The innovation includes not just the presence of the second gate in each RAM transistor but more importantly the unique and novel ways in which the second gate is connected and utilized. The typical advantage will be to separate the writing and reading functions of the cell into two independent control lines and signals, wherein one line, separate from the other, is connected to a different terminal of the access transistor. This separation of control for writing and reading allows each function to be optimized independent of the other function.

Double-Gated (DG) Field Effect Transistors (FETs) having independent gate control accomplish the function of two parallel single-gated transistors with only a single double-gated transistor. Wherever these Independently-Double-Gated (IDG) FETs can be used, a transistor is effectively eliminated, thereby producing a smaller, more efficient memory device. Through utilization of IDG FETs, the described memory cells can be made smaller and more efficiently, and will be more power efficient than previous designs.

An IDG transistor has been described in U.S. Pat. No. 7,015,547 with enhancements shown in U.S. patent application Ser. No. 11/307,863. These documents describe FETs suitable for the present invention, including a Bottom Gate (BG) in addition to an independently controllable Top Gate (TG). From a construction point of view, a bottom gate is disposed on the substrate, the channel is disposed on the bottom gate, and the top gate is disposed on the channel. The source is disposed on one side of the channel and isolated from the bottom gate and the top gate, and the drain is disposed on the other side of the channel and isolated from the bottom gate and the top gate, and electron flow through the channel is controlled solely by gate voltages.

In a typical RAM cell, data is imposed upon the source of a transistor through a Bit Line, and written through to a storage node at the drain under control of a Word Line connected to the gate of the transistor. The use of an IDG FET allows the Word Line connection to be made to the top gate while reserving the independent bottom gate to be available for other purposes.

Herein a Ferroelectric FeRAM cell is shown wherein the capacitor that would typically be required for storage can be eliminated, the cell being composed of a single transistor having a ferroelectric gate dielectric. This simple one transistor non-volatile, non-destructive read, fast program speed memory cell has long been sought after but considered impossible to achieve, giving way to cells using two or three single-gate transistors instead. One permutation of this cell, disclosed herein, consumes a cell area of only 2 $F^2$, by the sharing of contacts and program lines. This is twice the density of the highest density (4 $F^2$) memories previously reported.

Each RAM configuration has its own advantages and applications due to the available permutations of top gate and bottom gate connections, as will be described in conjunction with the figures of each different RAM cell schematic configuration. All possible permutations of top and bottom gate connections are available for exploration and possible exploitation.

The incorporation of double gate (DG) transistors improves existing RAM products, especially Non-Volatile NVRAMs. In general, the application of DG transistors offers to both volatile and non-volatile RAMs the advantages of:
  lower power dissipation,
  higher speed, or performance,
  higher density,
  greater endurance and robustness,
  tolerance to ionizing radiation single event effects (SEE) and total ionizing dose (TID) accumulation
  a higher level of functionality,
  lower cost,
  lower complexity, and
  ease of manufacture.

Additional aspects and advantages of this invention will be apparent from the following detailed description of preferred embodiments, which proceeds with reference to the accompanying drawings.

BRIEF DESCRIPTION OF THE DRAWINGS

The particular features and advantages of the invention briefly described above as well as other objects will become apparent from the following description taken in conjunction with the accompanying drawings, in which:

FIGS. 2, 3, and 4 show the possible connection modes of the IDG transistor.

FIG. 2 is a schematic representation of Single-Gated (SG) configurations of IDG transistor embodiments.

FIG. 3 is a schematic representation of Double-Gated (DG) transistor embodiments in which the two gates of the IDG transistor are tied together;

FIG. 4A is a schematic representation of Independently-Double-Gated (IDG) transistor embodiments with all connections independent;

FIG. 4B is a schematic representation of Independently-Double-Gated (IDG) ferroelectric transistor (FeFET) embodiments with all connections independent and capable of SG, DG or IDG connections similar to those depicted in FIGS. 2, 3, and 4A.

FIG. 14 is a table showing the Read, Write and Store operations of various memory cell configurations, especially of the preferred embodiment of a 1T NV-FeRAM;

DETAILED DESCRIPTION OF THE INVENTION

A variety of RAMs using conventional single-gated transistors are available in research and/or production in both volatile and non-volatile forms. Some of the more conventional of these are Static SRAM, Dynamic DRAM, and NOR- and NAND-Flash Memories. More recent developments include Ferroelectric FeRAM, Magnetic MRAM, Ovonic Unified Memory (OUM) under development by Ovonyx, Inc., and Phase Change PCRAM. Each of these forms of RAM can be improved in various ways by the incorporation of a second gate in each transistor used in the memory cell. Additionally, this second gate may be connected in a variety of useful configurations. The present invention describes modifications to existing DRAM, Flash, and FeRAM cell circuits to incorporate a second gate.

All known existing memory cells utilize single-gated transistors. Some transistors that are called "double-gated" are in use but with the two gates simply tied together. The present invention involves the application of any Independently-Double-Gated (IDG) transistor technology to improve existing memory cells and to realize new memory cells by using the independent second gate of each transistor to provide additional control and functionality. While the Flexfet™ IDG-CMOS technology (belonging to American Semiconductor, Inc.) produces a flexible FET that is specifically applicable to achieving these memory cell configurations, the techniques shown here may be applicable to the use of other double-gate devices as well. This disclosure describes how a second independently controllable gate in each transistor provides unique, novel configurations for improved memory cell function.

Figure 1:
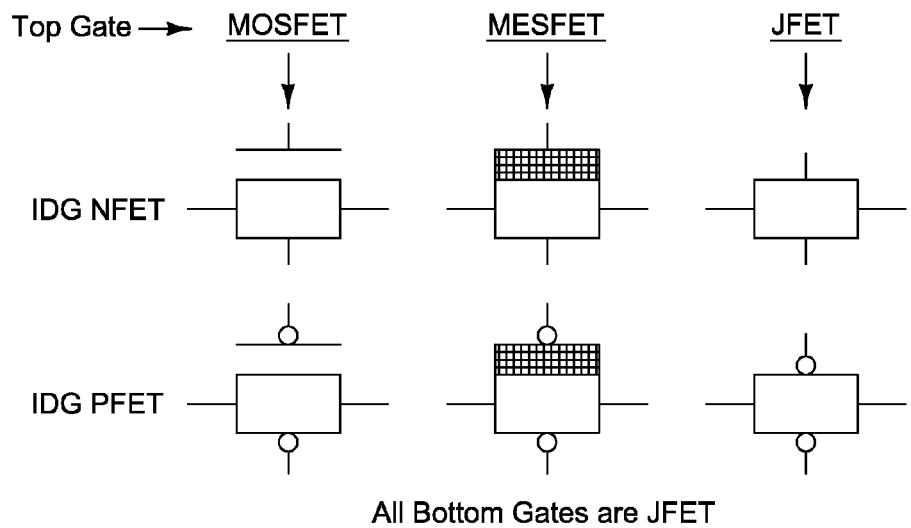
FIG. 1 shows schematic notations for a family of devices having various IDG (Independently-Double-Gated) transistor configurations with which the present invention can be implemented. The NMOS embodiments are shown in the upper row without bubbles on the gates, whereas the PMOS embodiments are shown on the lower row with bubbles on the gates.

In FIG. 1 are shown a variety of Independently-Double-Gated (IDG) Field Effect Transistors (FETs), each of which may be implemented as NMOS or PMOS. An N-channel transistor has N-type source and drain and a channel composed of free electrons. A P-channel transistor has P-type source and drain and a channel composed of free holes. A P-type transistor is shown schematically by placing a "bubble" or open circle on both the top gate and bottom gate inputs to indicate that they are active-low. In general, each of the two gates of an IDG transistor may be any of:

Metal-Insulator (Oxide)-Semiconductor (MOSFET),
Metal directly on Semiconductor (MESFET) with no insulator, or
Semiconductor Junction (JFET) having no metal or insulator.

Six (two by three) possible permutations of top and bottom gate types as MOSFET, MESFET or JFET are possible for both N-channel and P-channel devices as shown in FIG. 1. Particular emphasis will be placed on the devices at the left of the figure. These devices, with MOSFET top gates and JFET bottom gates, whether N-type or P-type, are known as Flexfet™ transistors, developed by American Semiconductor, Inc. These are planar IDG devices that have their top gate self-aligned to an ion-implanted bottom gate, specifically a silicon JFET bottom gate. The two self-aligned, independent gates control a single fully-depleted channel that is sandwiched between them. These independent top and bottom gates are contacted at opposite sides of the channel, which results in compact connections to all four transistor terminals (source, drain, top gate and bottom gate). The channel of this IDG transistor lies in the plane of the silicon wafer surface, similar to conventional CMOS single gate transistors, unlike those of the FinFET, Tri-gate, and other multi-gate transistors.

Figures 2, 3, 4A, 4B:
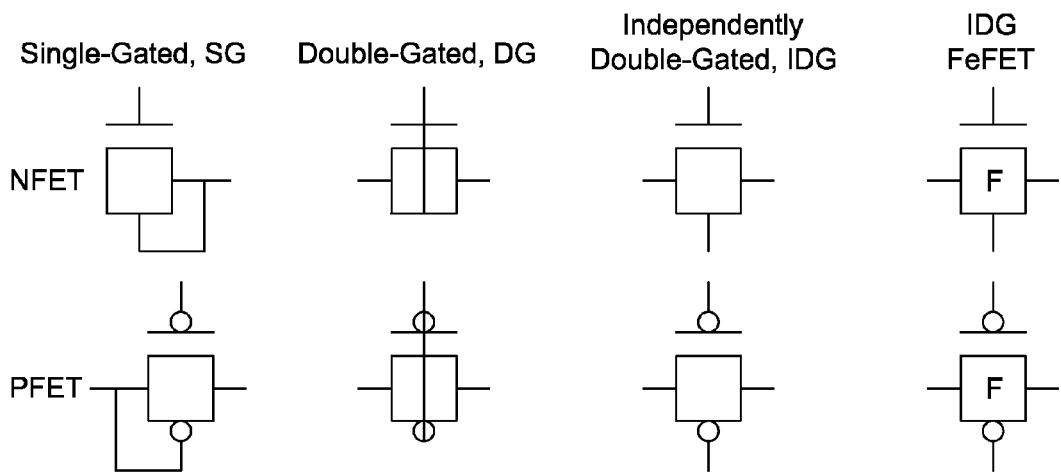

The basic four-terminal IDG FET may be connected in a number of useful three-terminal configurations as shown in FIGS. 2-4. As depicted in FIG. 2, the Single-Gated (SG) configuration has the bottom gate connected to the source, though it may be left to float. The Double-Gated (DG) transistors of FIG. 3 have their top and bottom gates connected together, as is the case with conventional double-gated transistors. The Independently-Double-Gated (IDG) transistors of FIG. 4 are true four-terminal devices, providing either independent bias or no bias (floating) to the top gate and the bottom gate. All of these devices may be applied to memory cells to serve varying purposes.

One key advantage of using IDG transistors in memory cells is that the independent gates allow for the separation of the writing and reading functions of the cell with two independent control lines, one for reading and the other for writing. This separation of the write and read functions enables each function to be independently optimized.

DRAM Implementations

Figure 5A:
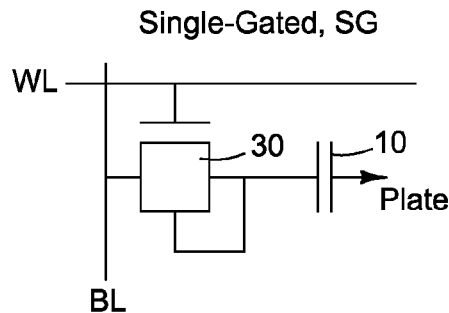
FIGS. 5A-5C are schematic diagrams of basic 1T-1C DRAM Cells implemented, respectively, using SG, DG, and IDG FETs.
Figure 5B:
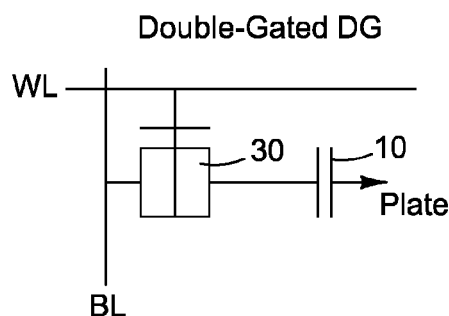
Figure 5C:
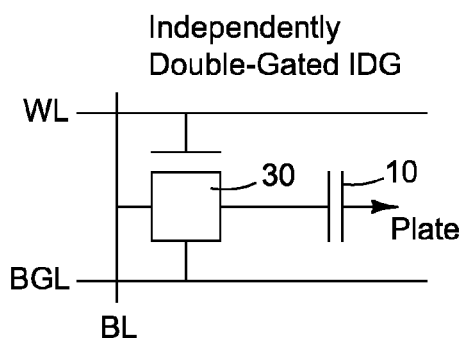

The discussion of the Dynamic RAM cells, with their lower component count, begins with reference to FIGS. 5A-5C. These figures show the traditional DRAM memory cell which consists of an access transistor 30 and a storage capacitor 15, that is, the basic One-transistor One-capacitor (1T-1C) design.

To write a data bit into a memory cell, the Word Line (WL) connected to the (top) gate of the transistor 30 is activated to turn the transistor On. Then, after the Bit Line (BL) has been driven to the appropriate high or low logic level, the transistor is shut Off, leaving the capacitor 15 charged either high or low. Since the necessary charge leaks off of the capacitor 15, it must be refreshed prior to the expiration of a maximum refresh interval.

To read, or to refresh the data in the cell, the bit line BL is left floating when the cell transistor 30 is turned On, and the small change in potential on the bit-line is sensed and amplified to recover a full logic level. The ratio of cell capacitance to bit-line capacitance, called the transfer ratio, which ranges from about 0.1 to 0.2, determines the magnitude of the change in bit-line potential. A suitably large cell capacitance is needed to deliver an adequate signal to the sense amplifier.

FIGS. 5A and 5B depict the single four-terminal transistors of choice connected as conventional three-terminal devices, single-gated (SG) in FIG. 5A, and double-gated (DG) in FIG. 5B. In these two configurations, the bottom gates of the transistors are shorted to either the device's source (SG, FIG. 5A) or to the device's top gate (DG, FIG. 5B). These configurations are similar to those that may be accomplished with common FETs.

In FIG. 5C the transistor 30 is again a four-terminal IDG FET but with all four terminals used to advantage. The availability of the bottom gate, independent of the top gate, allows control signal BGL to be applied to adjust the threshold voltage Vt. By shifting Vt to different values between Read and Write operations, low voltage operation is enabled without incurring any loss of read and write margins and leakage can be decreased to increase the time between refresh cycles.

Floating Body Cell (FBC) Implementations

Figure 6A:
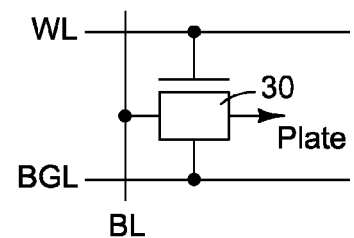
FIG. 6A shows the schematic diagram of a basic 1T-0C Floating Body Memory Cell (FBC) using an IDG FET with a common 2-D Plate.
Figure 6B:
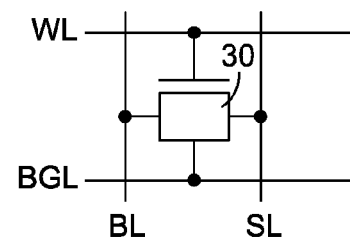
FIG. 6B shows the schematic of a basic 1T-0C FBC using an IDG FET with a decoded Source Line (SL)
Figure 7A:
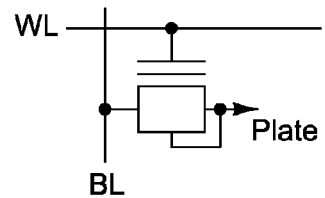
FIGS. 7A-7C show schematically NOR-type Flash Non-Volatile NVRAM Cells with a common 2-D Plate which are implemented, respectively, with SG, DG, and IDG FETs.
Figure 7D:
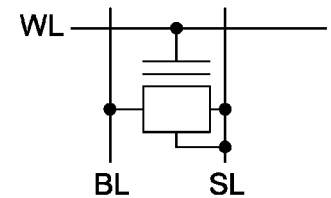
FIGS. 7D-7F are schematic diagrams of NOR-type Flash Non-Volatile NVRAM Cells using a decoded Source Line (SL) implemented, respectively, with SG, DG, and IDG FETs.
Figure 7B:
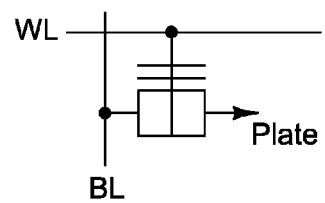
Figure 7E:
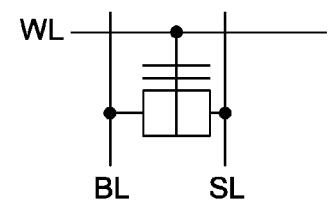
Figure 7C:
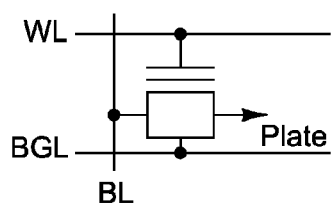
Figure 7F:
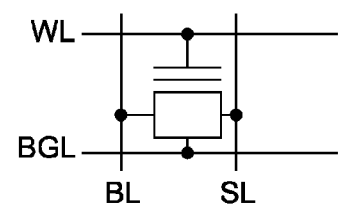

Removal of the defined capacitor from the basic 1T-1C DRAM circuit (of FIG. 5) results in a 1T-0C configuration, known as a Zero-capacitor DRAM, or FBC cell, one example of which is known as Z-RAM® (Innovative Silicon Inc.). Two new implementations of a 1T-0C FBC utilizing IDG FETs are shown in FIGS. 6A and 6B. In a FBC the data charge is stored in the body capacitance of a SOI MOSFET channel using the Floating Body (FB) effect. Such a capacitor-less memory cell is much smaller than a classical DRAM cell. The charge stored in the Floating Body affects the threshold voltage of the transistor sufficiently to provide two distinguishable states for memory of a single data bit without the need for an explicit capacitor. A "1" binary state is stored by biasing the transistor in saturation and injecting holes into the floating body, whereas applying a negative bias to the bit line (FET source) removes the charge from the floating body in order to store a binary "0" in the device. The bottom gate line is biased to keep the body isolated and floating in order to store data there.

To accomplish reading and writing, both of the designs in FIGS. 6A and 6B make use of two controls for cell selection, namely, WL (WordLine) and BL (BitLine). The voltage on the bottom gate in each circuit is controlled by BGL (Bottom gate Line) which establishes an optimal bias for each phase of the memory storage and retrieval operations. The implementation of FIG. 6A uses a common 2-D (two-dimensional) Plate, while that of FIG. 6B uses a decoded Source Line (SL) to provide capability for greater noise suppression.

Flash Memory Implementations

The charge stored in the floating body of the FET channel in a FBC leaks to the source/drain junction, as with all dynamic RAM configurations; it is volatile and must be refreshed. However, by injecting or tunneling charge to a dielectrically isolated floating gate, as in EPROM (Electrically-Programmable Read-Only Memory), a non-volatile memory results. In an EPROM this charge on the floating gate does not leak away over time, it is non-volatile, and therefore does need to be refreshed. Memory devices that use this floating gate mechanism are known as Non-Volatile NVRAM, one example of which is Flash Memory. The presence of charge on a floating gate determines whether or not the channel will conduct. A control gate, opposite the channel from the floating gate, is used to impose a charge on the floating gate during a write cycle. Floating gate IDG FETs can be used in one-transistor NVRAMs, where the topmost gate is connected to a wordline, the middle gate is a floating storage gate, and the bottom gate, used as a programming line, allows additional control features.

Two types of Flash Memory are referred to as NOR and NAND. The differences between the two types occur as a result of optimizations based upon differing constraints. Reading of data can be performed on individual addresses in NOR memories, but not in NAND. Unlocking of the NOR cells is required to make them available for erase or write. These operations are performed on all flash memories in a block-wise manner, with typical block sizes of 64 kB, 128 kB, or 256 kB. Though NOR-Flash offers faster read speed and random access capabilities, the write and erase functions are slow compared to NAND. NOR also has a larger memory cell size than NAND, which limits the ability to scale devices with advances in technology and therefore loses to NAND when considering achievable bit density. Conversely, NAND-Flash offers fast write and erase capability but is slower than NOR in the realm of read speed. The fast write and erase speed of NAND-Flash combined with its higher available densities, and resulting lower cost-per-bit, make it the preferred technology for many consumer applications which often require the ability to rewrite data quickly and repeatedly, such as for digital cameras, multi-function cell phones, MP3 players and USB data storage drives.

FIGS. 7A-7F are schematic representations of a variety of IDG FET NOR Flash cells containing a single floating gate transistor per cell. The configurations of FIGS. 7A-7C use a grounded plate, whereas the configurations shown in FIGS. 7D-7F use a decoded SourceLine (SL). Each of the single-gated (SG, FIGS. 7A and 7D), double-gated (DG, FIGS. 7B and 7E), and Independently-Double-Gated (IDG, FIGS. 7C and 7F) transistor configurations are usable.

Figure 8A:
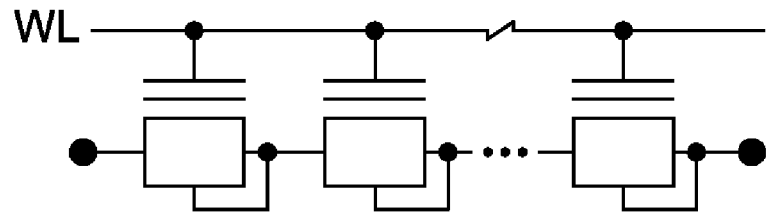
FIGS. 8A-8C are schematic diagrams of NAND Flash Non-Volatile NVRAM Cells implemented, respectively, using SG, DG, and IDG FETs.
Figure 8B:
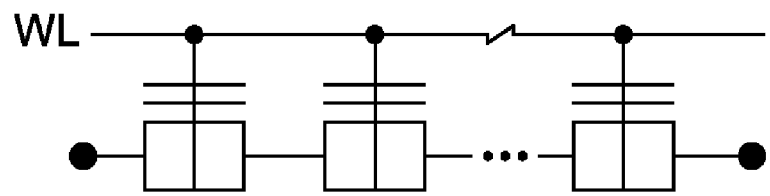
Figure 8C:
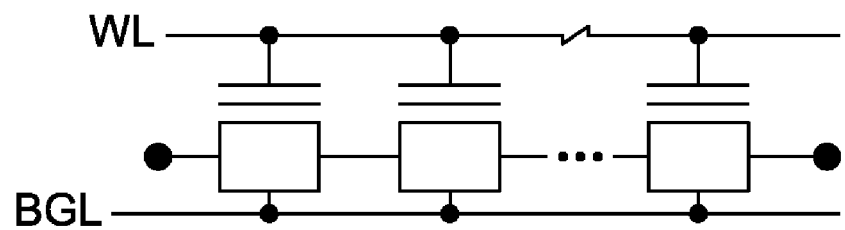

The NAND Flash cells shown schematically in FIGS. 8A-8C also contain a single floating gate IDG FET per cell. Here, the cells are connected in series in a stacked configuration with both drains and sources being shared with the transistors in the adjacent cells in the stack. One end of the stack is connected by a selection gate to a BitLine BL, while the other end of the stack is connected to a SourceLine SL by another selection gate. As with the NOR-Flash cells, each of the single-gated (FIG. 8A), double-gated (FIG. 8B), and Independently-Double-Gated (FIG. 8C) transistor configurations may be applied to create NAND-type Flash Non-Volatile NVRAM.

Hysteresis Field Effect Transistor (HyFET) Implementations

Recent high-K and alternative gate dielectric research has identified hysteresis as a common characteristic of many non-ferroelectric materials. High-K layer hysteresis phenomena have been identified as a major issue for gate dielectric integration of materials like Hafnium Oxide (HfO2) and Silicon Nitride. This characteristic is similar to that provided by ferroelectric materials used as a gate dielectric. While the characteristics provided by high-K and other hysteresis-producing materials are not desirable for standard MOSFET operation, they can be considered as ferroelectric material alternatives for integration into transistors to produce FeFET equivalent devices. A transistor where the hysteresis-producing material is used in lieu of a dielectric to form a Field Effect Transistor (FET) with a Metal—Hysteresis-producing material—Semiconductor structure can be referred to as Hysteresis Field Effect Transistor (HyFET).

A ferroelectric transistor is a transistor in which the gate insulator is replaced by a ferroelectric material to produce a Ferroelectric Field Effect (FeFET) transistor of Metal-Ferroelectric-Semiconductor (MFS). By taking advantage of the properties related to the hysteresis of the ferroelectric material, a Ferroelectric Field Effect Transistor (FeFET) memory cell can be constructed. Such a cell may be used as the basis of a compact Non-Volatile Ferroelectric Random Access Memory (FeRAM) that is capable of both high-speed reads and writes, on the order of nanoseconds, and has high endurance, in excess of $10^{10}$ cycles which compares with the $10^4$ cycle lifetime of an EEPROM. Another advantage of ferroelectric designs is that they offer compatibility with standard operating conditions since data can be stored at default operating voltages, as with transistor-capacitor memory designs, without requiring the higher voltage peaks common to floating-gate EPROM devices.

Another approach that uses ferroelectric materials begins with the basic 1T-1C circuit as described above for the DRAM but with a ferroelectric capacitor, hence a 1T-1FC cell. Though the achievable integration density of 1T-1FC cells is quite good, such cells are typically not as dense as Flash memory due to the large included ferroelectric MIM-Cap (Metal-Insulator-Metal Capacitor) which limits cell scaling. The 1T-1FC cell also suffers from destructive readout of the cell data, requiring the data to be rewritten after every read. FeRAM cells that contain a ferroelectric transistor (FeFET) are therefore more promising than capacitor-based cells with regard to cell scaling.

Construction of a variety of three, two or one transistor capacitor-less memory cells is made possible with IDG FETs where one of the transistors is a ferroelectric transistor. Alternately, coupling a ferroelectric capacitor to a single IDG FET can accomplish a 1T-1FC memory cell that is worthy of consideration. Furthermore, it will be recognized by those skilled in these arts that ferroelectrics are only one subset of the class of hysteresis-producing materials that may be used in the embodiments described here. It is also to be noted that those skilled in the art will recognize advantages to the inclusion of hysteresis-producing materials in the bottom gate as well as in the top gate of an IDG FET.

Most FeRAM cells have three decoded control lines per cell, usually named
BitLine (BL),
WordLine (WL) or Read WordLine (RWL), and
SourceLine (SL) or Write WordLine (WWL) or PlateLine (PL).

These signals are generally connected to the storage transistor at its drain, top gate, and source, respectively, or to the equivalent ports of a multi-transistor cell when a storage transistor is buffered by passgates.

Figure 9A:
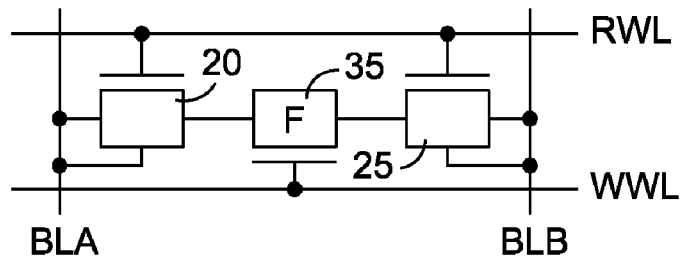
FIGS. 9A-9C are schematic diagrams of 3T FeRAM Cells using IDG FETs connected in SG, DG, and IDG modes, respectively.
Figure 9B:
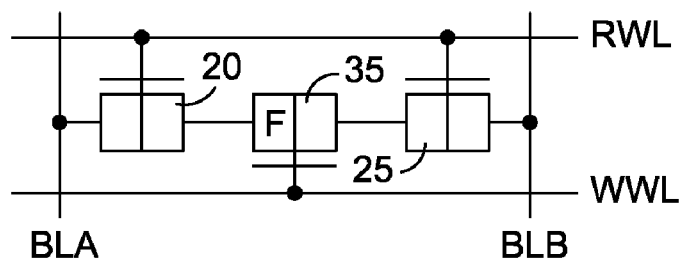
Figure 9C:
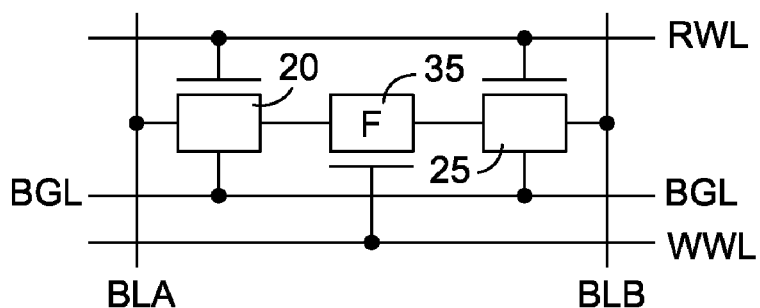

Various implementations of three-transistor (3T) capacitor-less memory cells are shown in FIGS. 9A-9C. Each of these configurations contains as the memory element a FeFET having a ferroelectric gate. The ferroelectric transistor 35 is flanked at each of its drain and source terminals by an IDG FET acting as a pass gate (20, 25). Due to the ferroelectric effect of the FeFET 35, it is easily written to either a logic '1' or '0' state by a single Write WordLine (WWL) at its top gate after its channel has been activated by establishing appropriate levels at its drain and source through pass gates 20, 25 tied to the Bit Line (BL) and its complement BLN, respectively. Once written, the data content stored in the FeFET 35 may be read by selecting the cell through Bit Lines BL and BLN followed by raising the Read WordLine (RWL) to turn on the pass gates 20, 25.

In FIG. 9A the IDG FET pass gates (20, 25) are connected in the single-gated (SG) mode. The bottom gate of the FeFET 35 memory element may float, as shown, or it may be connected to the top gate in double-gated (DG) fashion. A fully DG version of the 3T memory cell is shown in FIG. 9B, wherein all three transistors are double-gated devices, each transistor having its top and bottom gates tied together.

In the Independently-Double-Gated version of the 3T non-volatile FeRAM cell shown in FIG. 9C, the bottom gate of the FeFET 35 memory element floats, while the top gate is connected to the Write WordLine (WWL). The pass gates of this cell operate in their full four-terminal mode allowing their bottom gates to be preferentially biased to a Bottom gate Line (BGL). This provides flexibility as well as reduced programming voltages and improved timings.

Figure 10A:
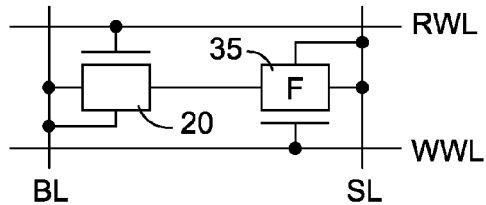
FIGS. 10A-10C are schematic diagrams of 2T FeRAM Cells using IDG FETs connected in SG, DG, and IDG modes, respectively.
Figure 10B:
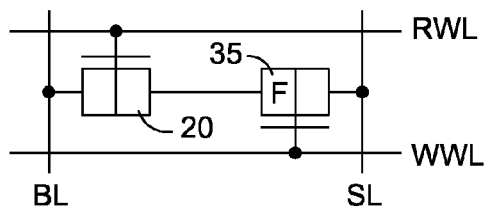
Figure 10C:
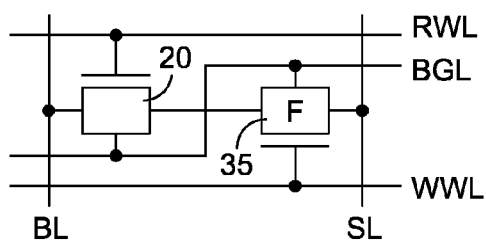

Reducing the transistor count from three to two yields the possible circuit configurations shown in FIGS. 10A-10C. For each of the depicted 2T memory cells, the pass gate (25, FIG. 9) between the FeFET 35 and the negative BitLine BLN of the corresponding 3T configurations has been replaced by a direct connection to a Source Line SL. FIG. 10A shows a single-gated (SG) version in which the bottom gate is tied to the source of each transistor. In the double-gated DG version of FIG. 10B the two transistors are treated in the familiar manner with each bottom gate tied to its corresponding top gate. Using both transistors in the four-terminal configuration results in the embodiment shown schematically in FIG. 10C. Here the bottom gates of both the MOSFET and the FeFET are tied to a Bottom gate Line (BGL) to facilitate greater control of the thresholds of the devices.

Figure 11A:
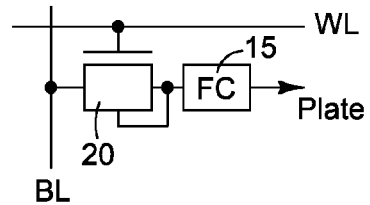
FIGS. 11A-11C are schematic diagrams of 1T-1FC FeRAM Cells using SG, DG, and IDG FETs, respectively with a Ferroelectric Capacitor (FC) connected to a Plate.
Figure 11B:
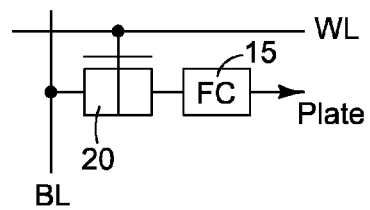
Figure 11C:
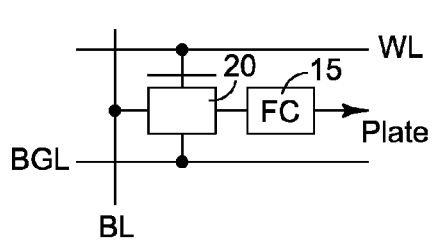

By replacing the FeFET 35 of the 2T memory cells of FIGS. 10A-10C with a ferroelectric capacitor, each of the configurations is converted to a corresponding 1T-1FC circuit as shown in FIGS. 11A-11C. Schematically, this circuit topology appears similar to that of the 1T-1C DRAM cells depicted in FIGS. 5A-5C, however in operation the ferroelectric capacitor 15 used here results in a Non-Volatile RAM, eliminating the need for the refresh circuitry of the DRAM cells.

As has been shown above, non-destructive reading of an FeRAM cell can be achieved by adding one or two non-ferroelectric access transistors in series with the ferroelectric storage transistor. This has been illustrated elsewhere, without the advantageous use of IDG FETs in the 1T-1FT FeRAM cell of Hoshiba described in U.S. Pat. No. 5,412,596 titled "Semiconductor storage device with a ferroelectric transistor storage cell." However, no matter how these extra transistors are constructed, their inclusion prevents the cell-size from being aggressively scaled. It would be desirable to avoid both destructive reading and read/write disturbances on adjacent cells with a simple, compact 1T FeRAM cell.

In 1996 Nishimura et. al. were granted U.S. Pat. No. 5,541,871 for a "Nonvolatile ferroelectric-semiconductor memory," where they described a floating gate 1T FeRAM cell utilizing the top gate as WordLine (WL), the source as SourceLine (SL; Nishimura's FIGS. 10-12, etc.) tied to the backgate (B; substrate of FIG. 4), and the drain as BitLine (BL). The structure of Nishimura et. al. leaves the middle metal layer in the stack as a floating gate (FG).

U.S. Pat. No. 5,856,688 titled "Integrated circuit memory devices having nonvolatile single transistor unit cells therein" was granted to Lee et al. in 1999. They show an extension of the structure of Nishimura et. al. by adding a second write bitline which is capacitively-coupled to a C-shaped floating gate. These Metal-Ferroelectric-Metal-Insulator-Semiconductor (MFMIS) cells have complicated layer stacks which are a burden to production.

Other inventors have recognized the value of transistors integrated with a ferroelectric (Fe) material as the gate dielectric to create a ferroelectric transistor (FeFET) for construction of memory cells. The primary advantage of using such materials has been that the resulting circuit is a dense, fast, non-volatile memory with a 4 $F^2$ cross-point cell, where F is the characteristic feature dimension for a given process. However, industry and research literature and experience indicate that, as a 1T cell, ferroelectric memories are unmanageable due to a write disturb problem.

A write disturb occurs when the write voltage is applied to the bitline. The undesirable behavior is that, even with the wordline Low, the write voltage drops across the ferroelectric gate causing the stored data bit to be rewritten uncontrollably. Indeed, there has been an industry-wide teaching away from the use of a FeFET in a 1T memory cell for this reason.

At the Nov. 5, 2002 Non-Volatile Memory Technology Symposium, in a presentation entitled "Static FeRAM: A Novel Ferroelectric Memory Approach" and prepared by industry pioneer Joseph T. Evans, Jr. of Radiant Technologies Inc., it was stated that "Another common misconception about ferroelectric transistors of any kind is that they can be used to form one-transistor memory cells. The concept is that the transistor can be used both as a memory element and its own isolation gate. This is not true . . . any application of a full write voltage to the source or drain will program the transistor even though the gate is not activated. Floating the gate does not eliminate the voltage disturb."

Evans then concluded,

"Therefore, the TFFT [Thin-Film Ferroelectric Transistor] can be used as the memory element but it must have a separate pass gate. This makes for a two-transistor memory cell, a unique situation that still results in a small footprint."

The FeRAM cell thus described by Evans is functionally equivalent to the single-gated device shown here in FIG. 10A.

Also in 2002 Nov. 27 Salling et. al. filed an application for "Junction-isolated depletion mode ferroelectric memory devices" which issued in 2005 as U.S. Pat. No. 6,876,022. The method used by Salling et. al. to prevent read disturb in an MFMIS cell involved adding a diode in series with the bitline contact. Though effective, this adds to the process complexity and reduces the read/write speed.

Complete protection from read/write disturbs without adding extra transistors or diodes to the cell can be achieved by adding a fourth control line to the memory transistor or cell. Koo et. al. showed this in their U.S. Pat. No. 5,959,879 for "Ferroelectric memory devices having well region word lines and methods of operating same," which issued in 1999, where they used a well region in the substrate below the transistor to provide a fourth terminal for an MFMIS transistor.

It would be desirable to build an FeRAM cell with no floating metal gate using a TFFT (Thin-Film Ferroelectric Transistor) as the memory element, where only the ferroelectric film exists between the metal top gate and the silicon channel in an MFS configuration in an SOI process without a separate pass gate. However, this requires a "friendly" ferroelectric material, one that will not adversely react with the silicon channel. It would be a desirable advancement of the art to incorporate a silicon-friendly ferroelectric into such a simple MFS 1T FeRAM cell. In spite of the teaching throughout the industry away from such a simple cell, the present invention in its preferred embodiment succeeds in eliminating the voltage disturb for such a cell. This is accomplished by the use of a fourth terminal, specifically the bottom gate of an IDG FeFET.

The MFS (Metal-Ferroelectric-Semiconductor) 1T FeRAM cell produced with an IDG-FeFET in the preferred embodiment contains all of these desirable attributes. In a typical configuration using a common ferroelectric one skilled in the art will recognize the need to isolate the ferroelectric from the Si channel by an interfacial barrier layer, an oxide such as $SiO_2$ being commonly used. This interfacial layer must be thinner than the thickness of the ferroelectric. Another possible configuration incorporates a silicon-friendly ferroelectric material that is capable of being in direct contact with the silicon channel, thereby requiring no interfacial barrier layer. There are no restrictions on gate material, but Titanium Nitride is one material that has been shown to optimize the hysteresis loop of some ferroelectric films to produce a wide voltage loop with a relatively square shape. In the preferred embodiment titanium nitride/tungsten is used for the top gate electrode.

Figure 12A:
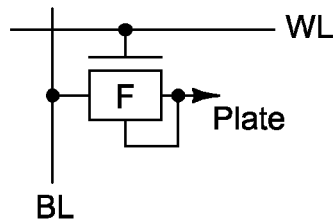
FIGS. 12A-12C are schematic diagrams of 1T-0C IDG FeFET RAM Cells using SG, DG, and IDG FETs, respectively, with the source connected to a Plate.
Figure 12B:
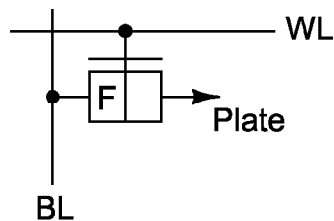
Figure 12C:
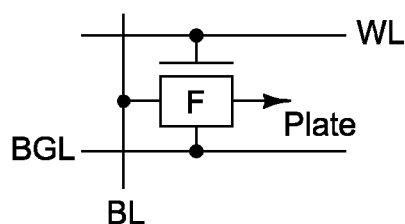
Figure 12D:
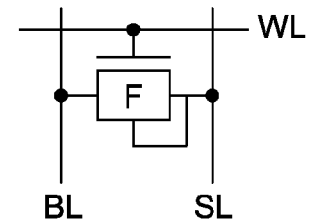
FIGS. 12D-12F are schematic diagrams of 1T-0C IDG FeFET RAM Cells using SG, DG, and IDG FETs, respectively, with the source connected to a Source Line.
Figure 12E:
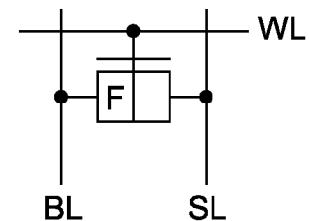
Figure 12F:
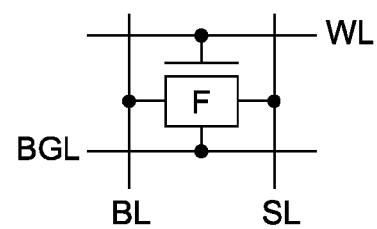

Referring to the various embodiments of FIG. 12, especially FIGS. 12E and 12F, it is seen that, in general, the top gate serves as the WriteLine, the drain serves as the BitLine, and the bottom gate serves as the WordLine. Because the bottom gate voltage can directly shift the hysteretic I-V curve of this transistor due to its dynamic threshold effect, the cell may be written at one threshold voltage, read at a lower threshold for high speed, and set to a high threshold to store data with low leakage. The ability to read, write, and store data by applying combinations of two gate control voltages and one source control voltage while only raising the electric field across the ferroelectric material during an addressed write operation is unique to this IDG FeRAM memory cell. This results in elimination of the classic read/write disturb problem that has prevented single-transistor FeRAM cell feasibility thus far. Unlike the cell of Koo et. al., the SourceLine does not have to be decoded or driven, and so may be simply grounded to a common plate, or the substrate, or connected to a Plate Line.

A single FeFET can replace the combination of a MOSFET coupled to a ferroelectric capacitor of the 1T-1FC memory cells shown in FIGS. 11A-11C, mapping those cells into the devices of FIGS. 12A-12F, to produce the corresponding 1FT-0C memories with their connections either to a Plate (FIGS. 12A-12C) or to a Source Line (FIGS. 12D-12F).

Available configurations of the 1FT-0C memory cells include the SG versions of FIGS. 12A and 12D, the DG implementations of FIGS. 12B and 12E, and the Independently-Double-Gated IDG forms shown in FIGS. 12C and 12F.

In the conventional circuit equivalent of the single-gated cell shown in FIG. 12A, the write voltage is applied to the BitLine at the drain and drops across the ferroelectric gate even when the WordLine is held low. This is the cause of the Write Disturb phenomenon. Such a 1T FeFET cell when implemented in standard CMOS does not work as desired.

Figure 13A:
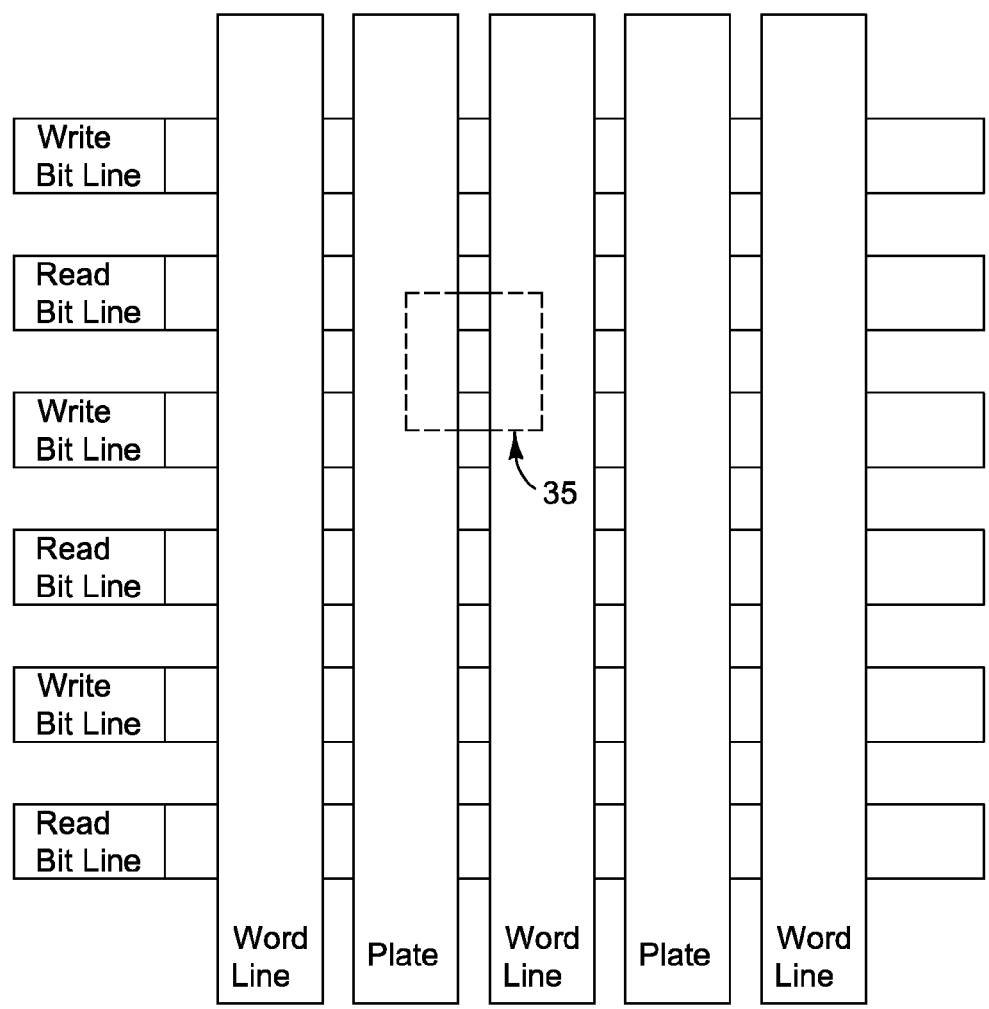
FIG. 13A is a layout for an IDG FET in a 1T-0C FeRAM Cell configuration as it is implemented in 4 F² area.

Removing the source of the IDG FeFET in FIG. 12C from a common Plate and tying it to a SourceLine (SL), as in FIG. 12F, results in a very compact topology. The layout of an array of these 1FT-0C memory cells is depicted in FIG. 13A which shows that the much desired classic 4 $F^2$ minimum area crosspoint, the "holy grail" of layouts, has been achieved.

Even greater density is possible by careful use of the full capability of the four-terminal IDG FeFET. A single-bit memory cell of FIG. 12F can be packed so as to require only a very compact area per bit that could approach 2 $F^2$. This is accomplished by connecting the source to a second data signal line, rather than to a Source Line, where the second data signal line is independent of the first data signal line at the drain.

Figure 13B:
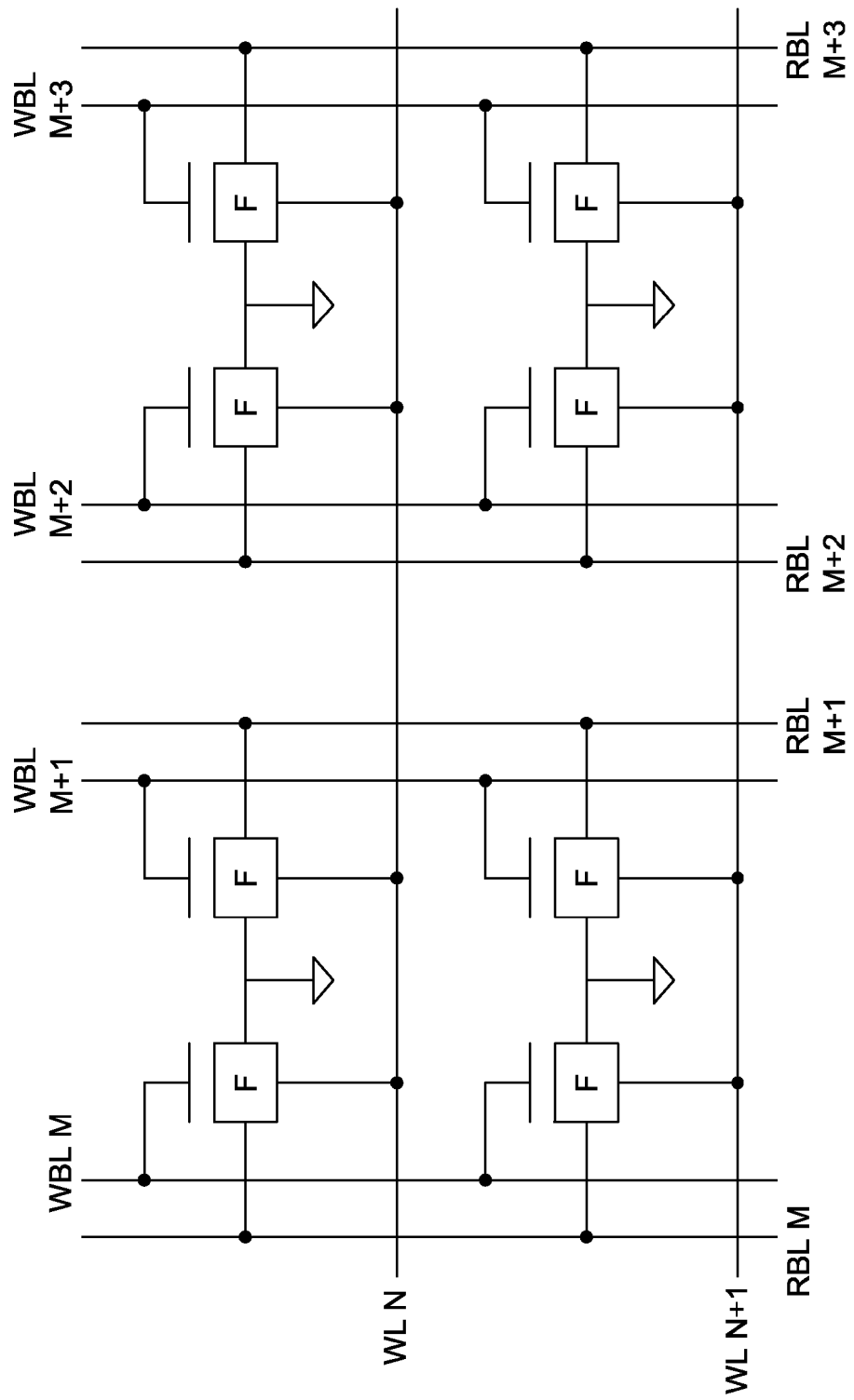
FIG. 13B shows a schematic diagram of an array of 1T-0C NV-FeRAM Cells for which the layout configuration is illustrated in FIG. 13A.
Figure 13C:
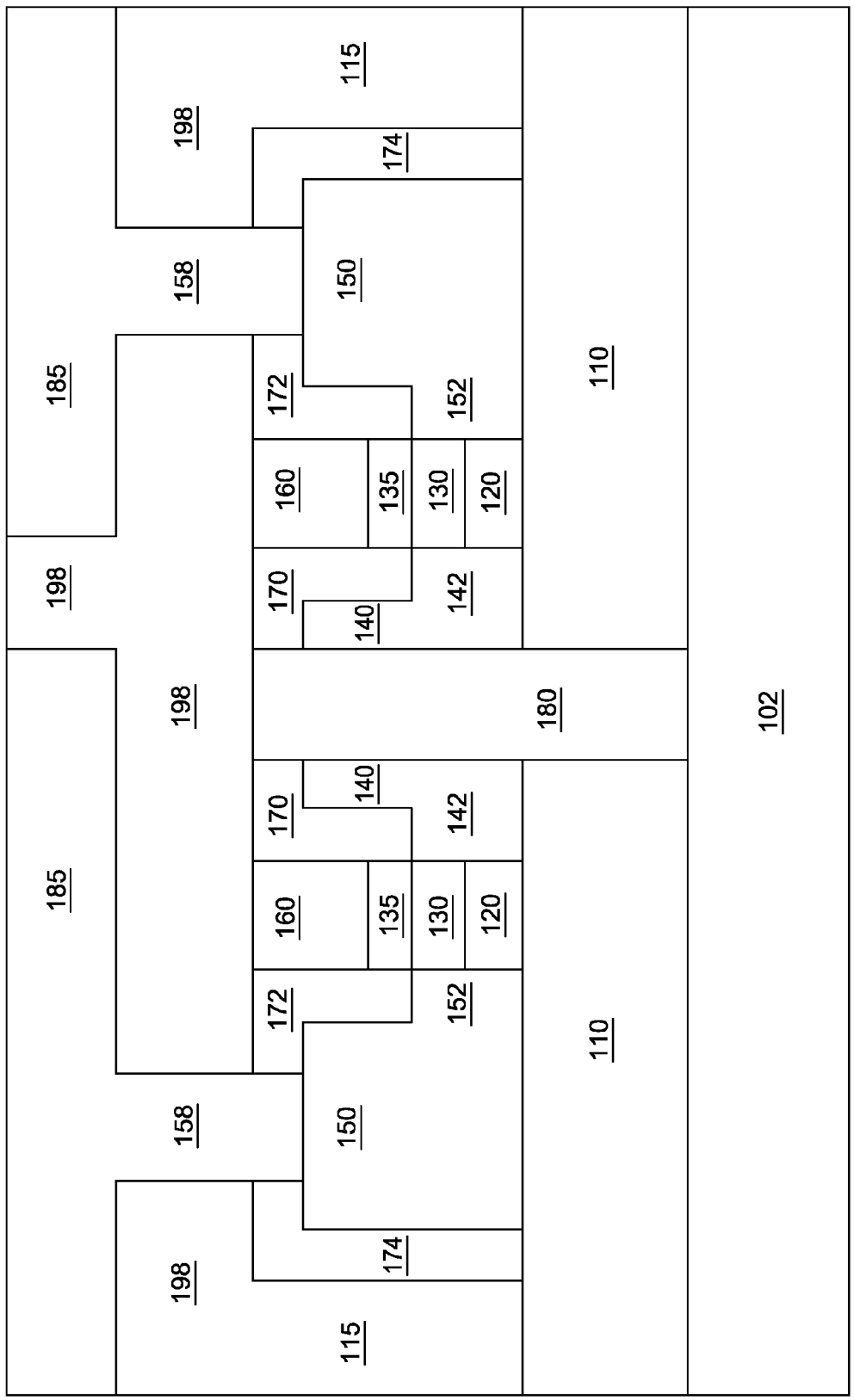
FIG. 13C is a cross-section diagram of a pair of the 1T NV-FeRAM cells.

In addition to their small size, the cells of FIGS. 12C and 12F offer the benefit of separate bit lines for read and write operations as shown in the 2×4 bit array depicted in FIG. 13B. A cross-section of a pair of the 1T NV FeRAM cells that results in 4 $F^2$ is shown in FIG. 13C. The simple gate stack of this configuration accomplishes the desired 1T cell with a minimum number of processing steps, all of which are totally compatible with Silicon. With a TiN top gate 160 stacked on a silicon-friendly ferroelectric 135 that can be placed in direct contact with the silicon channel, the series capacitance typical of other ferroelectrics that require a barrier dielectric is eliminated.

The high resistivity (SOI) layer and spacers 170, 172, 174, may all include nitride to separate and encapsulate the source 140, drain 150, bottom gate 120, and top gate 160 and increase radiation resistance. Radiation resistance is further increased in the four terminal embodiment wherein the bottom gate 120 is biased to sweep away accumulated charge. Remaining radiation sensitivity may be compensated by dynamic control of the bottom gate 120. Dynamic bottom gate compensation allows repair of the threshold voltage after extended radiation exposure.

Referring to FIG. 14, it can be seen that use of the bottom gate provides the control needed to shift the Vt window out of the range that would otherwise be sensitive to write disturbs, thereby resolving the write disturb issue in a 1T memory cell. Write voltage is only applied to the Write Bit-Line (WBL) at the top gate. This circumvents the concern voiced by Evans above that "any application of a full write voltage to the source or drain will program the transistor even though the gate is not activated." As shown in the table of operating voltages in FIG. 15, a write voltage of +/−1.0V is applied to the top gate while the drain is grounded. The Read Bit-Line (RBL) at the drain and the Word Line connected to the bottom gate require only 0.5V, resulting in a 1T NV-RAM cell capable of low voltage operation.

Figure 15:
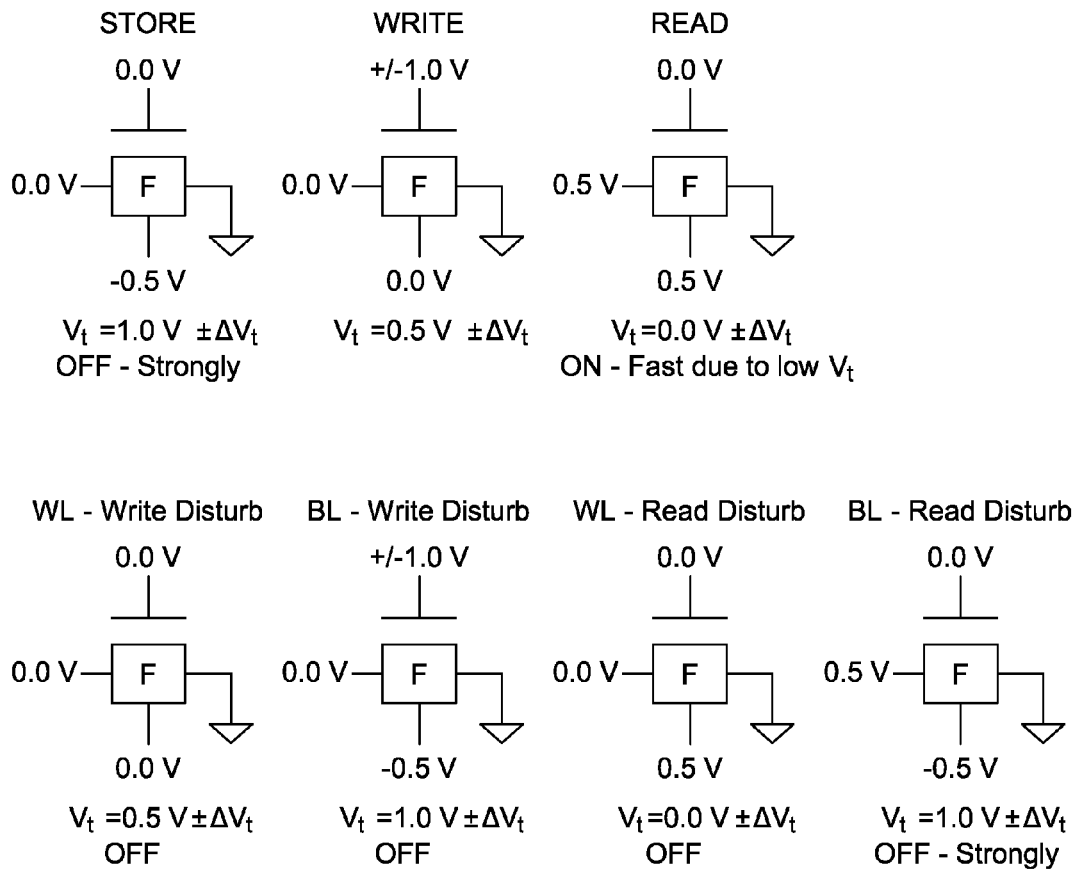
FIG. 15 shows various Operating Modes of the preferred embodiment of the 1T NV-FeRAM including both normal and disturb conditions; and The following Reference Numbers may be used in conjunction with one or more of the accompanying FIGS. 1-15 of the drawings:
10 Capacitor
15 Ferroelectric Capacitor
20 Passgate transistor
25 Passgate transistor
30 Independently-Double-Gated n-channel MOSFET with n-channel JFET
35 Independently-Double-Gated Ferroelectric Transistor (FeFET)
100 Flexible FET
102 Substrate
105 Silicon-On-Insulator (SOI) Layer
110 Buried Oxide (BOX)
115 Oxide
120 Bottom gate
130 Channel
135 Ferroelectric
140 Source
142 Source Extension
150 Drain
152 Drain Extension
160 Top gate
170 Insulating Spacer between Source and Top gate
172 Insulating Spacer between Drain and Top gate
174 Insulating Spacer
180 Plate Contact
185 Metal Interconnect between Memory Cells
198 InterLayer Dielectric (ILD) layer

The Read, Write and Store diagrams of FIG. 15 show the voltages appearing at each of the four terminals for those specific operations for a SELECTED (addressed) cell. The two Write Disturb diagrams show the conditions on an UNSELECTED cell on the same WordLine as the selected cell that is being WRITTEN, and an UNSELECTED cell on the same BitLine as the selected cell that is being WRITTEN. The two Read Disturb diagrams show the conditions on an UNSELECTED cell on the same WordLine as the selected cell that is being READ, and an UNSELECTED cell on the same BitLine as the selected cell that is being READ. These diagrams show the desired result, that the combination of top gate, bottom gate (threshold voltage control) and drain voltages for ALL four possible disturb conditions (a selected cell disturbing an unselected cell) are not adequate or sufficient to perform a write or toggling of the previously stored data state on the unselected cell.

Conclusions

The present invention provides enhancements to multiple families of memory cells that realize advantages through the effective use of Independently-Double-Gated (IDG) transistors. The use of an IDG FET as the core of each memory cell reduces circuit complexity leading to an improvement in layout density while also reducing power consumption and maintaining speed of operation. The implementations of memory cells shown here apply to any and all transistor technologies having independent double-gates, such as Trigate, FinFET, MigFET, etc., as long as the two gates are electrically separate, that is, they can be isolated each from the other. The techniques are directly applicable to the Flexfet™ IDG technology from American Semiconductor Inc.

Of the various single-gated volatile and non-volatile RAMs in research and/or production today, drawing examples from DRAM, NOR- and NAND-Flash, and FeRAM, each of these forms of RAM can be improved in various ways by the incorporation of a second gate in each transistor of the memory cell. In addition, there are a variety of useful configurations for connecting this second gate, such as SG or DG. This disclosure focuses on modifications to existing DRAM, Flash, and FeRAM cells to incorporate a second gate. Specifically, the incorporation of low-cost, planar Flexfet™ SOI IDG-CMOS technology into various new highly-advantageous RAM configurations has been shown here.

With the introduction of a ferroelectric material into the top gate, a non-volatile memory is achieved. Using an Independently-Double-Gated FET makes a single-transistor (1T) FeRAM feasible and results in a cell that meets the highly prized 4 $F^2$ density goal. The invented cell also provides a solution for Non-Destructive ReadOut (NDRO), as well as eliminating the problems of Disturb during Write and depolarization that have hindered advancement in the industry.

The presently invented FeRAM is also attractive for low power applications due to the reduction of gate or sub-$V_t$ current leakage, and is inherently radiation resistant. With its long data retention the described FeRAM provides a fast, low power alternative to Flash Memory as well as a low cost alternative to SRAM. Since the described devices can be produced by standard processes, requiring only one additional mask to embed ferroelectric material for the 1T FeRAM, the memory cells shown here may be used in standalone memory arrays or embedded into System-on-a-Chip (SOC) designs to significantly reduce overall system size.

It will be obvious to those having skill in the art that changes may be made to the details of the above-described embodiments without departing from the underlying principles of the invention. The scope of the present invention should, therefore, be determined only by the following claims.

What is claimed is:

1. A semiconductor memory cell, comprising:
an Independently-Double-Gated (IDG) field effect transistor (FET) configured to store data in a data storage capacitance,
wherein the IDG FET includes
a substrate,
a substrate dielectric disposed on the substrate,
a bottom gate disposed on the substrate dielectric,
a source disposed above the substrate dielectric and having a source extension extending from a main body of the source,
a drain disposed above the substrate dielectric and having a drain extension extending from a main body of the drain,
a channel confined by being coupled between the source extension and the drain extension, the channel creating a junction contact with the bottom gate to form a JFET,
a top gate disposed above the channel,
a first local interconnect coupled to the top gate,
a first insulating spacer disposed between the top gate and the source and proximate to the source extension, and
a second insulating spacer disposed between the top gate and the drain and proximate to the drain extension; and
a first control signal line coupled to the top gate, and
a capacitor coupled between the source of the IDG FET and a common plate,
wherein the drain of the IDG FET is coupled to a data signal line, and
wherein the data storage capacitance is the capacitor,
whereby a One-Transistor, One-Capacitor (1T-1C) DRAM is formed.

2. The semiconductor memory cell of claim 1, wherein the IDG FET further comprises:
a second local interconnect insulated from the first local interconnect and coupled to the bottom gate,
wherein the second local interconnect is also coupled to the source.

3. The semiconductor memory cell of claim 1, wherein the first local interconnect is also coupled to the bottom gate.

4. The semiconductor memory cell of claim 1, wherein the IDG FET further comprises:
a second local interconnect insulated from the first local interconnect and coupled to the bottom gate,
wherein the second local interconnect is also coupled to a second control signal line.

5. A semiconductor memory cell, comprising:
an Independently-Double-Gated (IDG) field effect transistor (FET) configured to store data in a data storage capacitance,
wherein the IDG FET includes
a substrate,
a substrate dielectric disposed on the substrate,
a bottom gate disposed on the substrate dielectric,
a source disposed above the substrate dielectric and having a source extension extending from a main body of the source,
a drain disposed above the substrate dielectric and having a drain extension extending from a main body of the drain,
a channel confined by being coupled between the source extension and the drain extension, the channel creating a junction contact with the bottom gate to form a JFET,
a top gate disposed above the channel,
a first local interconnect coupled to the top gate,
a first insulating spacer disposed between the top gate and the source and proximate to the source extension, and
a second insulating spacer disposed between the top gate and the drain and proximate to the drain extension; and
a first control signal line coupled to the top gate,
a first gate dielectric disposed between the channel and the top gate,
a floating gate disposed on the first gate dielectric; and
a second gate dielectric disposed between the floating gate and the top gate,
wherein the data storage capacitance is the capacitance of the floating gate,
whereby a Flash Memory cell is formed.

6. The semiconductor memory cell of claim 5, wherein the source is coupled to a common plate.

7. The semiconductor memory cell of claim 6, wherein the IDG FET further comprises:
a second local interconnect insulated from the first local interconnect and coupled to the bottom gate and to the source.

8. The semiconductor memory cell of claim 6, wherein the first local interconnect is also coupled to the bottom gate.

9. The semiconductor memory cell of claim 6, wherein the IDG FET further comprises:
a second local interconnect insulated from the first local interconnect and coupled to the bottom gate and to a second control signal line.

10. The semiconductor memory cell of claim 5, wherein the source is coupled to a decoded source line.

11. The semiconductor memory cell of claim 10, wherein the IDG FET further comprises:
a second local interconnect insulated from the first local interconnect and coupled to the bottom gate and to the source.

12. The semiconductor memory cell of claim 10, wherein the first local interconnect is also coupled to the bottom gate.

13. The semiconductor memory cell of claim 10, wherein the IDG FET further comprises:
a second local interconnect insulated from the first local interconnect and coupled to the bottom gate and to a second control signal line.

14. A NAND Flash Memory structure comprising:
a plurality of the semiconductor memory cell of claim 5,
wherein adjacent cells are connected, source to drain, in series.

15. The NAND Flash Memory structure of claim 14, wherein each IDG FET further comprises:
a second local interconnect insulated from the first local interconnect and coupled to the bottom gate and to the source.

16. The NAND Flash Memory structure of claim 14, wherein for each IDG FET the first local interconnect is also coupled to the bottom gate.

17. The NAND Flash Memory structure claim 14, wherein each IDG FET further comprises:
a second local interconnect insulated from the first local interconnect and coupled to the bottom gate and to a second control signal line.

18. A semiconductor memory cell comprising:
an Independently-Double-Gated Field Effect Transistor (IDG FET),
wherein the IDG FET includes
a first gate,
a drain,
a source,
a channel coupled between the drain and the source,
a second gate, and
a first local interconnect coupled to the first gate;
a ferroelectric capacitor (FC) coupled between the source of the IDG FET and a common plate;
a control signal line coupled to the first local interconnect of the IDG FET; and
a data signal line coupled to the drain of the IDG FET,
wherein the second gate adjusts a dynamic threshold of the channel to isolate the ferroelectric capacitor,
whereby a One-Transistor, One-Capacitor (1T-1C) Non-Volatile RAM cell is formed.

19. The semiconductor memory cell of claim 18, wherein the IDG FET further comprises:
a second local interconnect insulated from the first local interconnect and coupled to the second gate,
wherein the second local interconnect is also coupled to the source.

20. The semiconductor memory cell of claim 18, wherein the first local interconnect is also coupled to the second gate.

21. The semiconductor memory cell of claim 18, wherein the IDG FET further comprises:
a second local interconnect insulated from the first local interconnect and coupled to the second gate,
wherein the second local interconnect is also coupled to a second control signal line.

* * * * *